(12) United States Patent
Dai et al.

(10) Patent No.: US 10,527,947 B2
(45) Date of Patent: Jan. 7, 2020

(54) METHOD FOR EXPOSING TRANSPARENT SUBSTRATE

(71) Applicant: Shenzhen China Star Optoelectronics Technology Co., Ltd., Shenzhen, Guangdong (CN)

(72) Inventors: Wen Dai, Guangdong (CN); Peng Du, Guangdong (CN); Jianjian Ying, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 830 days.

(21) Appl. No.: 15/110,067

(22) PCT Filed: Jun. 23, 2016

(86) PCT No.: PCT/CN2016/086809
§ 371 (c)(1),
(2) Date: Jul. 6, 2016

(87) PCT Pub. No.: WO2017/210924
PCT Pub. Date: Dec. 14, 2017

(65) Prior Publication Data
US 2019/0204754 A1    Jul. 4, 2019

(30) Foreign Application Priority Data
Jun. 7, 2016   (CN) .......................... 2016 1 0399140

(51) Int. Cl.
*G02F 1/1337*    (2006.01)
*G03F 7/20*    (2006.01)
*G03F 1/50*    (2012.01)

(52) U.S. Cl.
CPC .... *G03F 7/70466* (2013.01); *G02F 1/133753* (2013.01); *G02F 1/133788* (2013.01);
(Continued)

(58) Field of Classification Search
CPC ......... G02F 1/133788; G02F 1/133753; G03F 7/70466; G03F 7/70283; G03F 7/2032
(Continued)

(56) References Cited

U.S. PATENT DOCUMENTS 5,657,105 A  *  8/1997  McCartney ....... G02F 1/133753
                                                          349/106
7,268,406 B2     9/2007  Yotsuya et al.
(Continued)

FOREIGN PATENT DOCUMENTS

CN       101520599 A       9/2009
CN       102725680 A      10/2012
(Continued)

OTHER PUBLICATIONS

Computer-generated translation of WO 2013/039100 (Mar. 2013). (Year: 2013).*

*Primary Examiner* — John A McPherson
(74) *Attorney, Agent, or Firm* — Andrew C. Cheng

(57) ABSTRACT

The disclosure discloses a method for exposing a transparent substrate, including: fixing relative positions of a first mask, a second mask and the transparent substrate; exposing various regions of the transparent substrate by light with different polarization directions generated by the first mask and the second mask respectively. By the method above, the disclosure can simplify the process, reduce the period and improve efficiency of production.

14 Claims, 4 Drawing Sheets

(52) U.S. Cl.
CPC .............. *G03F 1/50* (2013.01); *G03F 7/201* (2013.01); *G03F 7/2032* (2013.01)

(58) Field of Classification Search
USPC .................. 430/321, 394, 396; 349/124, 129
See application file for complete search history.

(56) References Cited

U.S. PATENT DOCUMENTS

| | | | |
|---|---|---|---|
| 7,787,085 B2 | 8/2010 | Kimura et al. | |
| 2007/0054198 A1 | 3/2007 | Park | |
| 2012/0064441 A1 | 3/2012 | Tanaka | |
| 2012/0308936 A1* | 12/2012 | Cho | G03F 1/00 430/319 |
| 2013/0130181 A1* | 5/2013 | Ou | G03F 7/2022 430/320 |
| 2014/0139813 A1* | 5/2014 | Wang | G03F 7/20 355/26 |
| 2016/0238927 A1 | 8/2016 | Liu et al. | |

FOREIGN PATENT DOCUMENTS

| | | | |
|---|---|---|---|
| JP | 2011081227 A | | 4/2011 |
| KR | 20070020824 A | | 2/2007 |
| TW | 201007351 A | | 2/2010 |
| TW | 201331682 A | | 8/2013 |
| WO | WO 2013/039100 | * | 3/2013 |

\* cited by examiner

METHOD FOR EXPOSING TRANSPARENT SUBSTRATE

FIELD OF THE DISCLOSURE

The disclosure relates to a liquid crystal technical field, and more particularly to a method for exposing a transparent substrate.

BACKGROUND OF THE DISCLOSURE

A high-generation glass substrate employs the multi mode glass (MMG) technology to improve a utilization rate of glass and reduce costs, which means arranging panels with various sizes on the glass substrate, by this way, area of abandoned substrates can be small and efficiency for cutting the glass substrate is high, for which is preferred by manufacturers of liquid crystal panels.

Arrangements of panels with various sizes on a large glass substrate can be different, which lead to various polarization directions of required polarized light during the photo alignment. In a conventional photo alignment process, a mask is generally applied in such a photo alignment process with multiple sizes. When one panel is aligned, panels with other arrangements will be shielded by a mask. Thereby multiple photo alignments are necessary, which can increase the time and reduce the efficiency of procedure.

SUMMARY OF THE DISCLOSURE

The technical issue that the disclosure solves is to provide a method for exposing a transparent substrate, which can simplify the process and reduce production period, and improve efficiency.

To solve the technical problems above, a proposal of the disclosure is: providing a method for exposing a transparent substrate, including: fixing relative positions of a first mask, a second mask and the transparent substrate; exposing various regions of the transparent substrate by light with different polarization directions generated by the first mask and the second mask respectively; a process of fixing relative positions of a first mask, a second mask and the transparent substrate includes: disposing the transparent substrate between the first mask and the second mask, the transparent substrate, the first mask and the second mask are parallel; a process of exposing various regions of the transparent substrate by light with different polarization directions generated by the first mask and the second mask respectively includes: light generated by a first light source penetrating the first mask to be irradiated on the transparent substrate; light generated by a second light source penetrating the second mask to be irradiated on the transparent substrate simultaneously.

The first mask and the second mask each include a light transmitting region and a light shading region, and the light transmitting region and the light shading region of the first mask correspond to the light shading region and the light transmitting region of the second mask respectively.

A process of fixing relative positions of a first mask, a second mask and the transparent substrate includes: disposing the first mask, the second mask and the transparent substrate horizontally; or disposing the first mask, the second mask and the transparent substrate vertically.

Steps of exposing various regions of the transparent substrate by light with different polarization directions generated by the first mask and the second mask respectively include: exposing various regions of the transparent substrate by light with different polarization directions generated by the first mask and the second mask respectively, controlling intensity of the light with different polarization directions, in order to equate exposure of the various regions of the transparent substrate.

Steps of exposing various regions of the transparent substrate by light with different polarization directions generated by the first mask and the second mask respectively include: exposing the various regions of the transparent substrate by light with polarization directions vertical mutually generated by the first mask and the second mask respectively.

Sizes of the various regions of the transparent substrate are different.

A process of exposing various regions of the transparent substrate by light with different polarization directions generated by the first mask and the second mask respectively includes: exposing the various regions of the transparent substrate by light with different polarization directions generated by the first mask and the second mask respectively in order to photo alignment.

To solve the technical problems above, another proposal of the disclosure is: providing a method for exposing a transparent substrate, including: fixing relative positions of a first mask, a second mask and the transparent substrate; exposing various regions of the transparent substrate by light with different polarization directions generated by the first mask and the second mask respectively.

A process of fixing relative positions of a first mask, a second mask and the transparent substrate includes: disposing the transparent substrate between the first mask and the second mask, the transparent substrate, the first mask and the second mask are parallel; a process of exposing the various regions of the transparent substrate by light with different polarization directions generated by the first mask and the second mask respectively includes: light generated by a first light source penetrating the first mask to be irradiated on the transparent substrate; light generated by a second light source penetrating the second mask to be irradiated on the transparent substrate.

The first mask and the second mask each include a light transmitting region and a light shading region, and the light transmitting region and the light shading region of the first mask correspond to the light shading region and the light transmitting region of the second mask respectively.

A process of fixing relative positions of a first mask, a second mask and the transparent substrate includes: disposing the first mask, the second mask and the transparent substrate horizontally; or disposing the first mask, the second mask and the transparent substrate vertically.

A process of exposing various regions of the transparent substrate by light with different polarization directions generated by the first mask and the second mask respectively includes: exposing the various regions of the transparent substrate simultaneously by light with different polarization directions generated by the first mask and the second mask respectively.

Steps of exposing various regions of the transparent substrate by light with different polarization directions generated by the first mask and the second mask respectively include: exposing the various regions of the transparent substrate by light with different polarization directions generated by the first mask and the second mask respectively, controlling intensity of the light with different polarization directions, in order to equate exposure of the various regions of the transparent substrate.

Steps of exposing various regions of the transparent substrate by light with different polarization directions generated by the first mask and the second mask respectively include: exposing the various regions of the transparent substrate by light with polarization directions vertical mutually generated by the first mask and the second mask respectively.

Sizes of the various regions of the transparent substrate are different.

A process of exposing various regions of the transparent substrate by light with different polarization directions generated by the first mask and the second mask respectively includes: exposing the various regions of the transparent substrate by light with different polarization directions generated by the first mask and the second mask respectively for photo alignment.

Advantageous effects of the disclosure: distinguishing from a conventional technique, according to the disclosure, relative positions of the first mask, the second mask and the transparent substrate are fixed; various regions of the transparent substrate are exposed by light with different polarization directions generated by the first mask and the second mask respectively. Instead of applying the first mask and the second mask separately, the first mask, the second mask and the transparent substrate are all fixed, various regions of the transparent substrate are exposed by light with different polarization directions generated by the first mask and the second mask respectively, the manner can simplify the process, reduce production period and improve efficiency for procedure.

DETAILED DESCRIPTION OF PREFERRED EMBODIMENTS

Embodiments of the disclosure are described in detail with reference to the accompanying drawings as follows.

Figure 1:
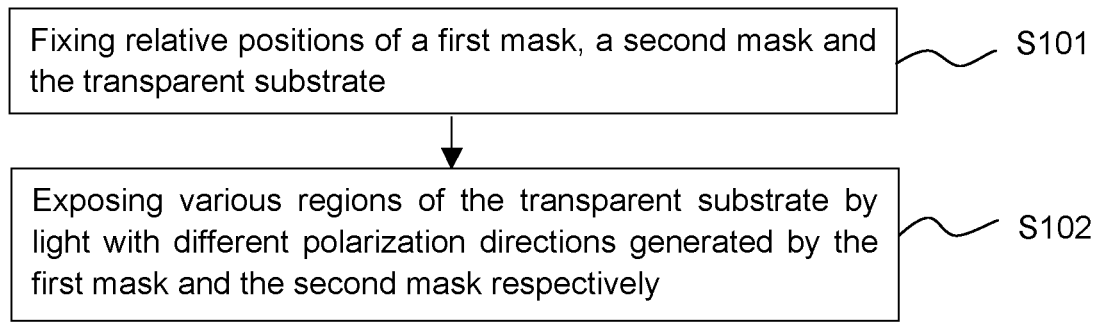
FIG. 1 is a flow chart of a method for exposing a transparent substrate according to an embodiment the disclosure.

Referring to FIG. 1, FIG. 1 is a flow chart of a method for exposing a transparent substrate according to an embodiment the disclosure, including:

Step S101: fixing relative positions of a first mask, a second mask and the transparent substrate.

Step S102: exposing various regions of the transparent substrate by light with different polarization directions generated by the first mask and the second mask respectively.

According to actual requirements, relative positions of the first mask, the second mask and the transparent substrate are fixed, the first mask and the second mask can be fixed on two sides of the transparent substrate respectively, or on the same side of the transparent substrate.

Directions of polarized light penetrating the first mask and the second mask are different, the first mask and the second mask correspond to the various regions of the transparent substrate respectively. Above can be achieved by at least two manners, one is providing polarized light with different directions, the polarized light with different directions penetrates the first mask and the second mask respectively; the other is that the first mask and the second mask contain a function of a polarizer, polarized light with different polarization directions will be generated after passing through the first mask and the second mask respectively.

Therefore, light with different polarization directions can be generated after penetrating the first mask and the second mask, the light with different polarization directions can expose the various regions of the transparent substrate.

The first mask, the second mask and the transparent substrate are all fixed instead of applying the first mask and the second mask separately, various regions of the transparent substrate are exposed by light with different polarization directions generated by the first mask and the second mask respectively, the manner can simplify the process, reduce production period and improve efficiency for procedure.

The step S101 can specifically include: disposing the transparent substrate between the first mask and the second mask, the transparent substrate, the first mask and the second mask are parallel; disposing the transparent substrate between the first mask and the second mask means disposing the first mask and the second mask on two sides of the transparent substrate, by this way, exposure of various regions of the transparent substrate simultaneously is possible, which can provide technical preparation for reducing the period and improve efficiency, and facilitating the process for fixing the first mask and the second mask.

The step S102 can be specifically: light generated by a first light source penetrates the first mask to be irradiated on the transparent substrate; light generated by a second light source penetrates the second mask to be irradiated on the transparent substrate.

The first mask and the second mask each include a light transmitting region and a light shading region, and the light transmitting region and the light shading region of the first mask correspond to the light shading region and the light transmitting region of the second mask respectively. That is, the light transmitting region of the first mask is the light shading region in the second mask; the light shading region of the first mask is the light transmitting region in the second mask.

The step S101 can further be: disposing the first mask, the second mask and the transparent substrate horizontally; or disposing the first mask, the second mask and the transparent substrate vertically.

If the first mask and the second mask are on the same side of the transparent substrate, two proposals will be offered, which are disposing the first mask, the second mask and the transparent substrate horizontally, the first mask and the second mask are both above or below the transparent substrate; or disposing the first mask, the second mask and the transparent substrate vertically, the first mask and the second mask are both on the right or left side of the transparent substrate.

If the first mask and the second mask are on two sides of the transparent substrate, two proposals will be provided as well: disposing the first mask, the second mask and the transparent substrate horizontally, the first mask and the second mask are above and below the transparent substrate respectively; or disposing the first mask, the second mask and the transparent substrate vertically, the first mask and the second mask are on the right and the left sides of the transparent substrate respectively.

The step S102 can further include: exposing various regions of the transparent substrate by light with different polarization directions generated by the first mask and the second mask respectively.

That is, when various regions of the transparent substrate are exposed, light with different polarization directions generated by the first mask and the second mask will be applied in exposure simultaneously, which can be benefit for reducing the period.

The step S102 can further include: exposing various regions of the transparent substrate by light with different polarization directions generated by the first mask and the second mask respectively, controlling intensity of the light with different polarization directions, in order to equate exposure of the various regions of the transparent substrate.

Differences of light penetration may exist between two sides of the transparent substrate or various spots on the same side, in order to equate exposure of the various regions of the transparent substrate, intensity of the light with different polarization directions can be controlled, for instance: intensity of the light on spots with poor light transmission can be increased.

The step S102 can further include: exposing the various regions of the transparent substrate by light with polarization directions vertical mutually generated by the first mask and the second mask respectively. That is, polarization directions of the generated polarized light after penetrating the first mask and the second mask are perpendicular, by this way, a vertical pattern can be obtained after exposure.

Sizes of the various regions of the transparent substrate are different.

The step S102 can include: exposing the various regions of the transparent substrate by light with different polarization directions generated by the first mask and the second mask respectively in order to photo alignment.

Figure 2:
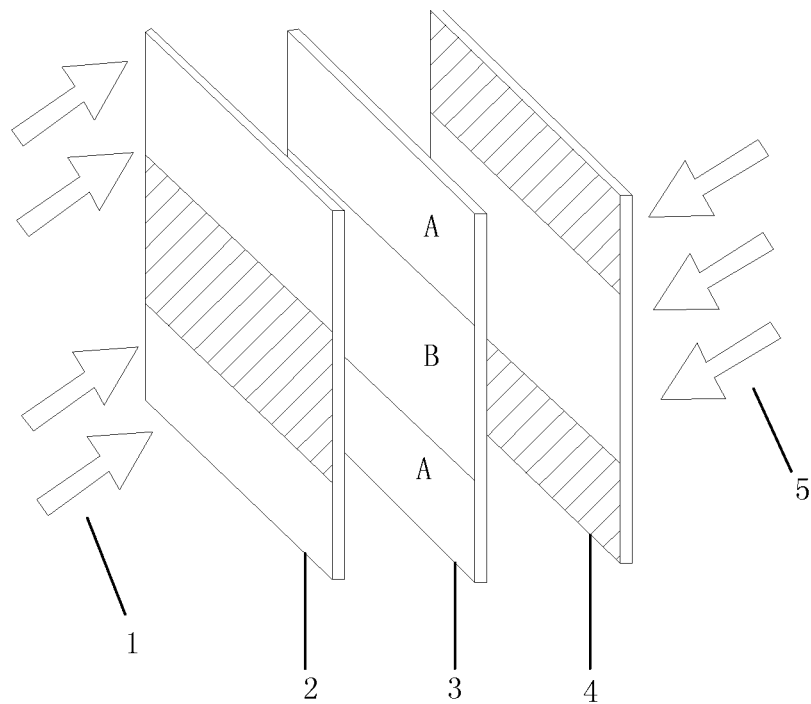
FIG. 2 is a schematic structural view of a glass substrate disposed vertically with photo alignment in a method for exposing a transparent substrate according to an embodiment the disclosure.

The photo alignment is taken as an example to illustrate the method of the disclosure. The transparent substrate is for example a glass substrate, the light is for example ultraviolet polarized light. The first mask and the second mask are fixed on the two sides of the glass substrate respectively, and the ultraviolet polarized light with different polarization directions is deployed respectively. Proposals respectively are:

Proposal one: the glass substrate is disposed vertically, UV polarized light on right side and that on the left side of the glass substrate penetrate the first mask and the second mask vertical on the two sides respectively, and the regions of the glass substrate with various sizes are photo aligned. Referring to FIG. 2, FIG. 2 is a schematic structural view of a glass substrate disposed vertically with photo alignment of an embodiment, from left to right it shows a UV polarized light source 1 (shown as an arrow), a first mask 2 (a shadow region is the light shading region, coated with an opaque material), a glass substrate 3 (parts A and B correspond to regions of the glass substrate with various sizes respectively), a second mask 4 (shadow regions are the light shading regions, coated with an opaque material), a UV polarized light source 5, the glass substrate 3, the first mask 2 and the second mask 4 can be fixed by clamps.

Figure 3:
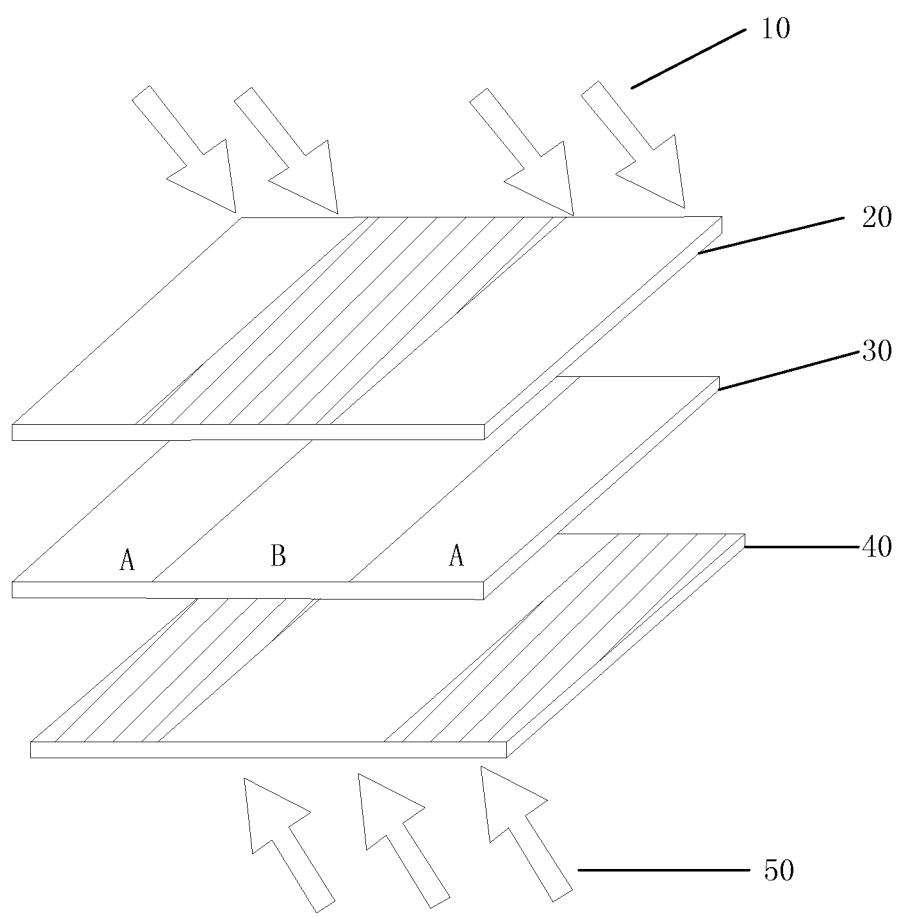
FIG. 3 is a schematic structural view of a glass substrate disposed horizontally with photo alignment in a method for exposing a transparent substrate according to an embodiment the disclosure.

Proposal two: the glass substrate is disposed horizontally, UV polarized light on upper side and that on the lower side of the glass substrate penetrate the first mask and the second mask horizontal respectively, and the regions of the glass substrate with various sizes are photo aligned. Referring to FIG. 3, FIG. 3 is a schematic structural view of a glass substrate disposed horizontally with photo alignment of an embodiment, from top to bottom it shows a UV polarized light source 10, a first mask 20 (a shadow region is the light shading region, coated with an opaque material), a glass substrate 30 (parts A and B correspond to regions of the glass substrate with various sizes respectively), a second mask 40 (shadow regions are the light shading regions, coated with an opaque material), a UV polarized light source 50, the glass substrate 30, the first mask 20 and the second mask 40 can be fixed by clamps.

Figure 4:
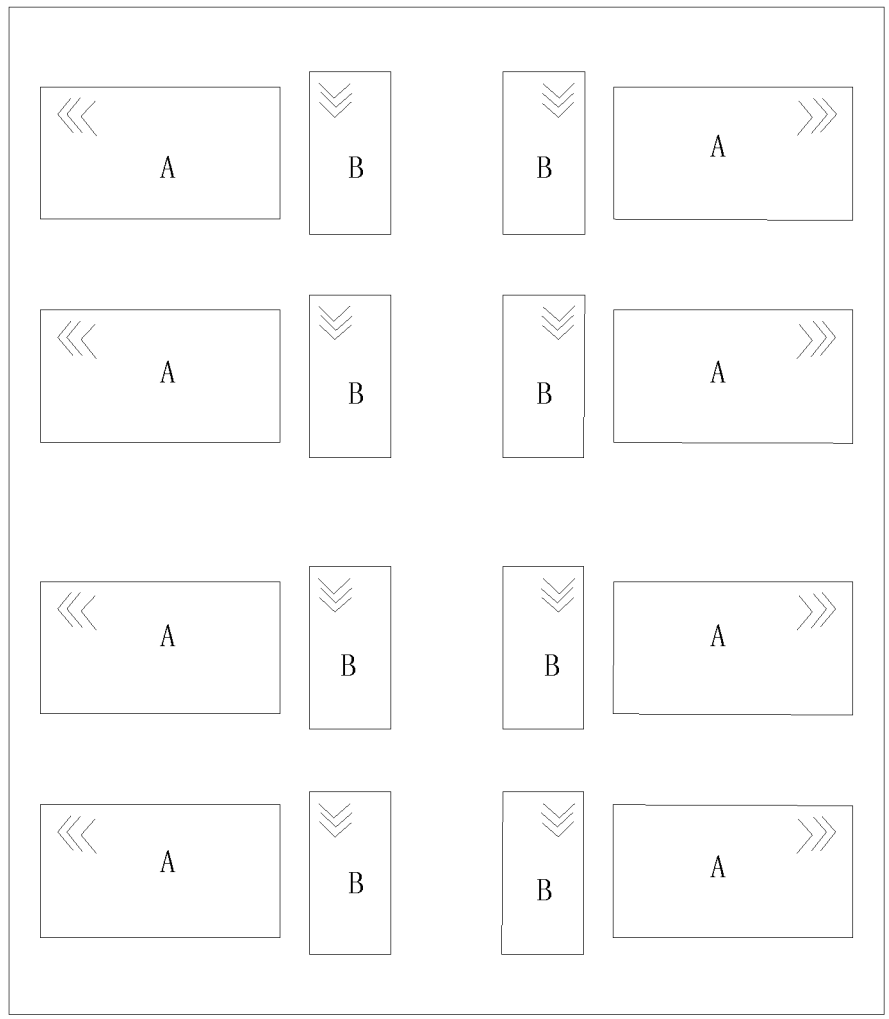
FIG. 4 is a schematic view of an 8.5-generation glass substrate with a mixed arrangement of two sizes of 43 inches and 22 inches with 8 pieces each.
Figure 5:
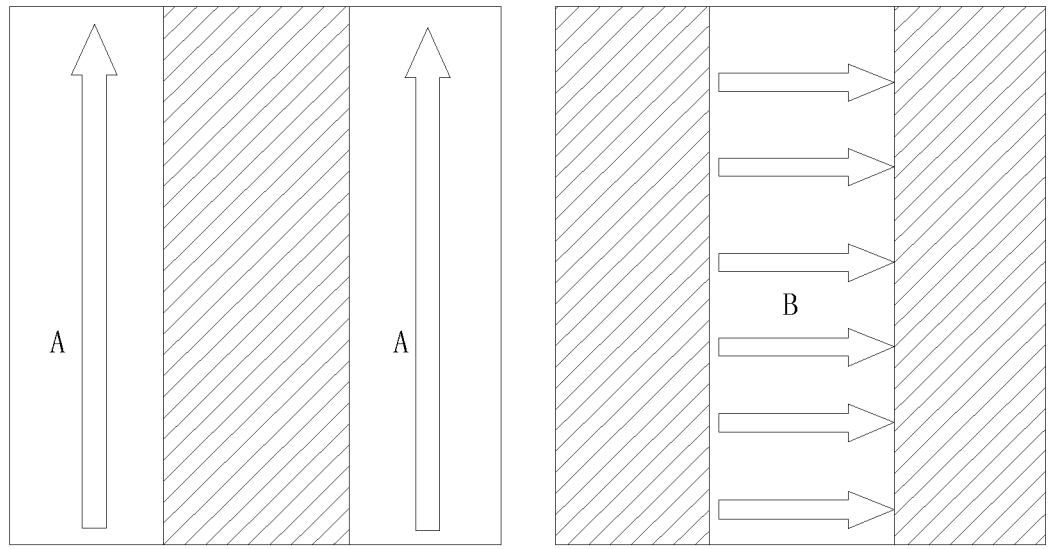
FIG. 5 is a schematic view of two masks applied in photo alignment in FIG. 4 with a method for exposing a transparent substrate according to the disclosure.
Figure 6:
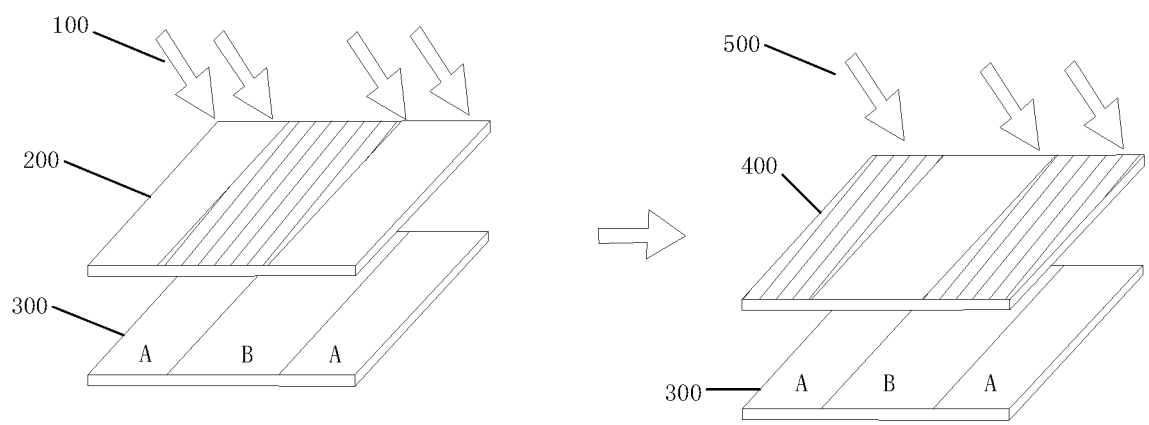
FIG. 6 is a schematic view of a conventional technique of photo alignment by irradiating a glass substrate twice.

An 8.5-generation glass substrate (2.5 m*2.2 m) is taken as an example, as shown in FIG. 4, a piece of 8.5-generation glass substrate can include a mixture of two sizes of 43 inches (parts A in FIG. 4) and 22 inches (parts B in FIG. 4) with 8 pieces each, which can improve the utilization rate of the glass substrate. FIG. 5 is two masks applied in photo alignment of the glass substrate in FIG. 4, shadow regions are the light shading regions to shield regions unnecessary to be irradiated, and arrows indicate polarization directions of ultraviolet polarized light, so as to satisfy requirements of photo alignment in various regions. FIG. 6 is a schematic view of a conventional technique of photo alignment by irradiating a glass substrate 300 in an in-plane switching (IPS)/fringe field switching (FFS) panel twice, a first mask 200 blocks the part B, then ultraviolet polarized light 100 photo aligns the parts A during first irradiation, similarly, a second mask 400 blocks the parts A, then ultraviolet light 500 photo aligns the part B during second irradiation, photo alignment of the parts A and the part B of the entire glass substrate 300 is completed.

The disclosure is capable of completing photo alignment of the parts A and B of the entire glass substrate once by the proposal of FIG. 2 or FIG. 3. Photo alignment of the entire glass substrate can be completed in one irradiation process, altering the process or additional masks will be unnecessary, which can improve efficiency significantly. Intensity of ultraviolet light out of a TFT or CF substrate can be increased appropriately due to ultraviolet light on two sides of an array substrate (i.e. a thin film transistor (TFT) substrate or a color filter (CF) substrate) may be different, so as to guarantee identical ultraviolet light intensity irradiated on an alignment film during photo alignment, improving uniformity of processes.

Overall, the disclosure improves efficiency and reduces processes and costs for manufacturing a liquid crystal panel without sacrificing effects of photo alignment.

Above are embodiments of the disclosure, which do not limit the scope of the disclosure, any modifications, equivalent replacements or improvements within the spirit and principles of the embodiments described above should be covered by the protected scope of the disclosure.

What is claimed is:
1. A method for exposing a transparent substrate, wherein it comprises:
fixing relative positions of a first mask, a second mask and the transparent substrate;
exposing various regions of the transparent substrate by light with different polarization directions generated by the first mask and the second mask respectively;
a process of fixing relative positions of a first mask, a second mask and the transparent substrate comprising:

disposing the transparent substrate between the first mask and the second mask, the transparent substrate, the first mask and the second mask being parallel;

a process of exposing various regions of the transparent substrate by light with different polarization directions generated by the first mask and the second mask respectively comprising:

light generated by a first light source penetrating the first mask to be irradiated on the transparent substrate; light generated by a second light source penetrating the second mask to be irradiated on the transparent substrate simultaneously;

wherein the first mask and the second mask each comprise a light transmitting region and a light shading region, and the light transmitting region and the light shading region of the first mask correspond to the light shading region and the light transmitting region of the second mask respectively; and wherein the light transmitting region of the first mask and the light shading region of the second mask are the same size, and the light shading region of the first mask and the light transmitting region of the second mask are the same size.

2. The method according to claim 1, wherein the process of fixing relative positions of a first mask, a second mask and the transparent substrate comprises:

disposing the first mask, the second mask and the transparent substrate horizontally; or disposing the first mask, the second mask and the transparent substrate vertically.

3. The method according to claim 1, wherein steps of the exposing various regions of the transparent substrate by light with different polarization directions generated by the first mask and the second mask respectively comprise:

exposing various regions of the transparent substrate by light with different polarization directions generated by the first mask and the second mask respectively, controlling intensity of the light with different polarization directions, in order to equate exposure of the various regions of the transparent substrate.

4. The method according to claim 1, wherein steps of the exposing various regions of the transparent substrate by light with different polarization directions generated by the first mask and the second mask respectively comprise: exposing the various regions of the transparent substrate by light with polarization directions vertical mutually generated by the first mask and the second mask respectively.

5. The method according to claim 1, wherein sizes of the various regions of the transparent substrate are different.

6. The method according to claim 1, wherein a process of exposing various regions of the transparent substrate by light with different polarization directions generated by the first mask and the second mask respectively comprises:

exposing the various regions of the transparent substrate by light with different polarization directions generated by the first mask and the second mask respectively so as to photo alignment.

7. A method for exposing a transparent substrate, wherein it comprises:

fixing relative positions of a first mask, a second mask and the transparent substrate;

exposing various regions of the transparent substrate by light with different polarization directions generated by the first mask and the second mask respectively;

wherein the first mask and the second mask each comprise a light transmitting region and a light shading region, and the light transmitting region and the light shading region of the first mask correspond to the light shading region and the light transmitting region of the second mask respectively; and wherein the light transmitting region of the first mask and the light shading region of the second mask are the same size, and the light shading region of the first mask and the light transmitting region of the second mask are the same size.

8. The method according to claim 7, wherein a process of fixing relative positions of a first mask, a second mask and the transparent substrate comprises:

disposing the transparent substrate between the first mask and the second mask, the transparent substrate, the first mask and the second mask being parallel;

a process of exposing various regions of the transparent substrate by light with different polarization directions generated by the first mask and the second mask respectively comprising:

light generated by a first light source penetrating the first mask to be irradiated on the transparent substrate; light generated by a second light source penetrating the second mask to be irradiated on the transparent substrate.

9. The method according to claim 7, wherein a process of fixing relative positions of a first mask, a second mask and the transparent substrate comprises:

disposing the first mask, the second mask and the transparent substrate horizontally; or disposing the first mask, the second mask and the transparent substrate vertically.

10. The method according to claim 7, wherein a process of exposing various regions of the transparent substrate by light with different polarization directions generated by the first mask and the second mask respectively comprises:

exposing the various regions of the transparent substrate simultaneously by light with different polarization directions generated by the first mask and the second mask respectively.

11. The method according to claim 7, wherein steps of the exposing various regions of the transparent substrate by light with different polarization directions generated by the first mask and the second mask respectively comprise:

exposing the various regions of the transparent substrate by light with different polarization directions generated by the first mask and the second mask respectively, controlling intensity of the light with different polarization directions, in order to equate exposure of the various regions of the transparent substrate.

12. The method according to claim 7, wherein steps of the exposing various regions of the transparent substrate by light with different polarization directions generated by the first mask and the second mask respectively comprise: exposing the various regions of the transparent substrate by light with polarization directions vertical mutually generated by the first mask and the second mask respectively.

13. The method according to claim 7, wherein sizes of the various regions of the transparent substrate are different.

14. The method according to claim 7, wherein a process of exposing various regions of the transparent substrate by light with different polarization directions generated by the first mask and the second mask respectively comprises:

exposing the various regions of the transparent substrate by light with different polarization directions generated by the first mask and the second mask respectively so as to photo alignment.

* * * * *